(12) United States Patent
Yamashita

(10) Patent No.: US 9,093,352 B2
(45) Date of Patent: Jul. 28, 2015

(54) SOLID-STATE IMAGING DEVICE AND METHOD OF CONTROLLING THE SAME

(71) Applicant: Kabushiki Kaisha Toshiba, Minato-ku (JP)

(72) Inventor: Hirofumi Yamashita, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/091,458

(22) Filed: Nov. 27, 2013

(65) Prior Publication Data

US 2014/0084348 A1    Mar. 27, 2014

Related U.S. Application Data

(62) Division of application No. 12/884,806, filed on Sep. 17, 2010, now Pat. No. 8,841,707.

(30) Foreign Application Priority Data

Dec. 16, 2009  (JP) ................................. 2009-285419

(51) Int. Cl.
*H01L 27/148* (2006.01)
*H01L 27/146* (2006.01)

(52) U.S. Cl.
CPC .... *H01L 27/14806* (2013.01); *H01L 27/14603* (2013.01); *H01L 27/14612* (2013.01); *H01L 27/14689* (2013.01); *H01L 27/14643* (2013.01)

(58) Field of Classification Search
USPC ............ 257/222, 225, E27.15, 414, 229, 239, 257/431, 443, 461; 438/59, 74, 76, 78
See application file for complete search history.

(56) References Cited

U.S. PATENT DOCUMENTS 6,677,656 B2  1/2004 François
6,690,423 B1  2/2004 Nakamura et al.
(Continued)

FOREIGN PATENT DOCUMENTS

CN  101079967 A  11/2007
JP  11-214668  8/1999
(Continued)

OTHER PUBLICATIONS

Combined Taiwanese Office Action and Search Report issued Feb. 14, 2014 in Patent Application No. 099130204 (with English language translation).

(Continued)

*Primary Examiner* — Robert Bachner
(74) *Attorney, Agent, or Firm* — Oblon, McClelland, Maier & Neustadt, L.L.P.

(57) ABSTRACT

According to one embodiment, a solid-state imaging device includes a semiconductor region, a first diffusion layer, a second diffusion layer, a third diffusion layer, an insulating film, a potential layer, and a read electrode. The semiconductor region includes first and second surfaces. The first diffusion layer is formed in the first surface. The first diffusion layer's concentration is a maximum value in a position at a first depth. The charge accumulation layer has a second depth. The second diffusion layer contacts the first diffusion layer. The third diffusion layer is formed in a position which faces the second diffusion layer in respect to the first diffusion layer. The insulating film is formed on the first surface. The potential layer is formed on the insulating film and has a predetermined potential. The read electrode is formed on the insulating film.

7 Claims, 6 Drawing Sheets

(56) References Cited

U.S. PATENT DOCUMENTS

| | | | |
|---|---|---|---|
| 2002/0117699 A1 | 8/2002 | Francois | |
| 2004/0108502 A1 | 6/2004 | Nakamura et al. | |
| 2007/0158709 A1* | 7/2007 | Mouli | 257/291 |
| 2007/0210395 A1* | 9/2007 | Maruyama et al. | 257/431 |

FOREIGN PATENT DOCUMENTS

| | | |
|---|---|---|
| JP | 2007-258684 | 10/2007 |
| JP | 2009-16826 | 1/2009 |

OTHER PUBLICATIONS

Combined Chinese Office Action and Search Report issued Nov. 26, 2012 in Chinese Patent Application No. 201010529542.X (w/English-language translation).

Office Action mailed Sep. 3, 2013 in Japanese Application No. 2009-285419 filed Dec. 16, 2009 (w/English translation).

Taiwanese Office Action issued Nov. 14, 2014, in Taiwan Patent Application No. 099130204 (with English translation).

* cited by examiner

SOLID-STATE IMAGING DEVICE AND METHOD OF CONTROLLING THE SAME

CROSS-REFERENCE TO RELATED APPLICATIONS

This application is a division of and claims the benefit of priority under 35 U.S.C. §120 from U.S. Ser. No. 12/884,806 filed Sep. 17, 2010, and claims the benefit of priority under 35 U.S.C. §119 from Japanese Patent Application No. 2009-285419 filed Dec. 16, 2009; the entire contents of each of which are incorporated herein by reference.

FIELD

Embodiments described herein relate generally to a solid-state imaging device and a method of controlling the same, for example.

BACKGROUND

In a solid-state imaging device, such as a CMOS, an electron-hole pair is produced in a semiconductor substrate by light that has passed through a filter, and only electrons are accumulated in an N-type diffusion layer, which functions as a charge accumulation portion, as disclosed in Jpn. Pat. Appln. KOKAI Publication No. 2007-258684.

Recently, due to demand for increase in number of pixels and reduction in optical size, the N-type diffusion layer tends to be reduced in size. This results in reduction in the number of electrons (hereinafter referred to as "number of saturated electrons") that may be accumulated in the N-type diffusion layer, and deteriorates quality of a photographed image at the time of playback.

DETAILED DESCRIPTION

Figure 1:
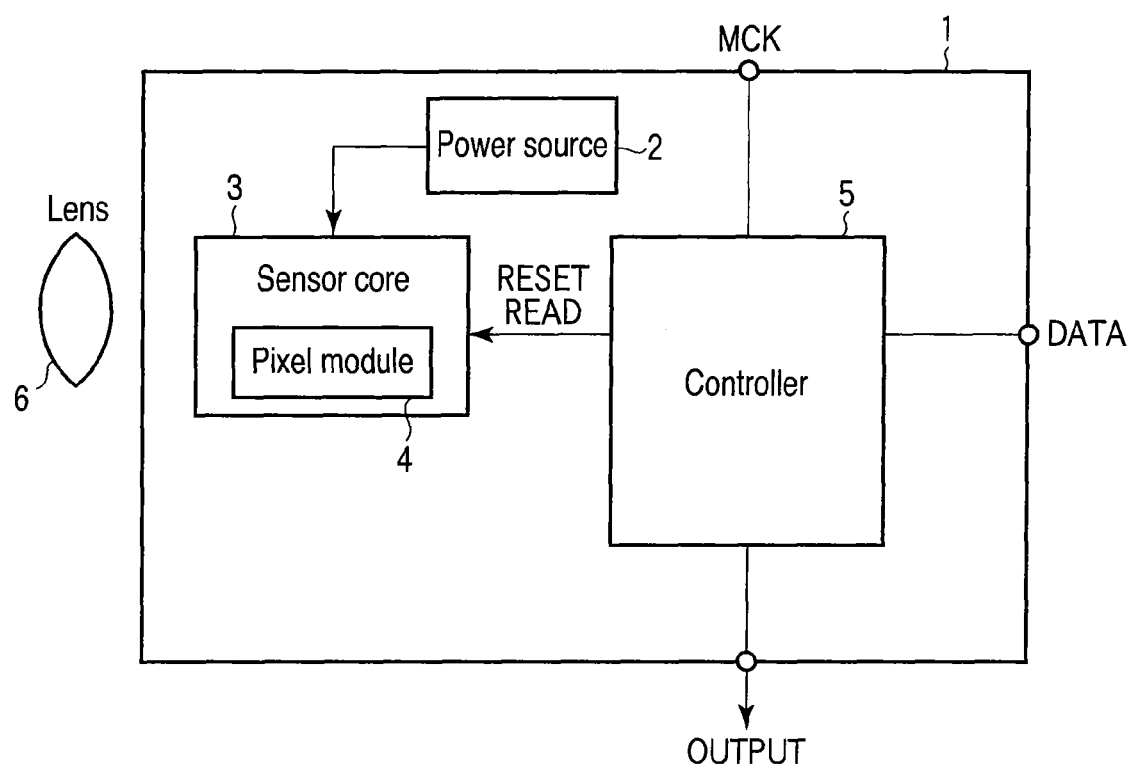
FIG. 1 is a block diagram of a solid-state imaging device according to a first embodiment.

Hereinafter, a first embodiment will be described with reference to the accompanying drawings. In this description, the common elements will be referred to by the common reference numerals throughout the drawings.

In general, according to one embodiment, a solid-state imaging device includes a semiconductor region, a first diffusion layer, a second diffusion layer, a third diffusion layer, an insulating film, a potential layer, a read electrode. The semiconductor region is a first conductivity type or a second conductivity type. The semiconductor region includes a first surface and a second surface facing the first surface. The first diffusion layer is formed in the first surface of the semiconductor region. The first diffusion layer is second conductivity type. The first diffusion layer is doped such that a concentration becomes a maximum value in a position at a first depth from the first surface of the semiconductor region. The charge accumulation layer of the first conductivity type has a second depth smaller than the first depth from an interface between the first surface of the semiconductor region and a surface of the first diffusion layer is formed when an electron produced in the semiconductor region by light irradiated toward the first surface from the second surface of the semiconductor region is accumulated in the first diffusion layer which functions as a charge accumulation portion. The second diffusion layer is the first conductivity type, at least a portion of the second diffusion layer contacting the first diffusion layer. The third diffusion layer is the second conductivity type formed in the first surface of the semiconductor region. The third diffusion layer is formed in a position which faces the second diffusion layer in respect to the first diffusion layer. The insulating film is formed on the first surface of the semiconductor region. The potential layer is formed on the insulating film corresponding to the first diffusion layer. The potential layer has a predetermined potential. The read electrode is formed on the insulating film in a position between the first diffusion layer and the third diffusion layer.

First Embodiment

A solid-state imaging device and a method of controlling the same according to the first embodiment will be described below, with reference to FIG. 1. FIG. 1 illustrates a configuration example of a solid-state imaging device according to the first embodiment. In the embodiments that will be described below, a solid-state imaging device of a back irradiation type will denote that of a back irradiation type, unless otherwise noted.

As shown in FIG. 1, a solid-state imaging device 1 includes a power module 2, a sensor core 3, a controller 5, and a lens 6. The sensor core 3 includes a pixel module 4. Hereinafter, each of the elements will be described in detail.

The power module 2 produces a plurality of predetermined voltages, and applies the produced voltage to the sensor core 3 including the pixel module 4. The power module 2 is capable of producing a negative voltage, and is capable of supplying the produced negative voltage to the pixel module 4.

The sensor core 3 includes a plurality of pixels (hereinafter simply referred to as pixels) arranged in a matrix. In the pixel module 4, a reset operation is performed on the pixels and a signal read operation is performed on the selected pixel based on the signals RESET and READ supplied from the controller 5.

Next, a controller 5 will be described. The controller 5 generates an internal clock of the solid-state imaging device 1 based on a clock signal given from a master clock MCK. The master clock MCK is a clock signal obtained by using a clock (hereinafter referred to as an external clock), for example, provided outside the solid-state imaging device 1 as a reference. Further, the controller 5 receives control data (shown as DATA) for operating the overall system of the solid-state imaging device 1 from the outside. The control data includes a command, operation timing for operating the overall solid imaging device 1, and the like. More specifically, it is operation timing at which the power module 2 applies a negative voltage to the pixel module 4 in reading a signal of light received at the pixel module 4. Of the commands received from the outside, the controller 5 gives the RESET signal and the READ signal, for example, to the pixel module 4. Further, the controller 5 performs a signal processing operation on the signal read by the sensor core 3, and outputs the signal to the outside.

The lens 6 receives light from the outside, lets the received light pass through a decomposition filter, and then supplies the light to the pixel module 4. This filter decomposes light according to the RGB.

The solid-state imaging device may include a correlated double sampling (CDS) circuit, an analog-to-digital conversion circuit (hereinafter referred to as an ADC module), a latch circuit, and a horizontal shift register, as well as the sensor core 3 and the pixel module 4. In that case, the CDS cancels the noise included in the signal read from the pixel module 4. The analog-to-digital converter performs an analog-to-digital conversion on the signal in which the noise has been canceled by the CDS. Thereby, a digital signal of 10 bits, for example, is obtained. Further, the latch circuit latches a digital signal obtained in the ADC portion. The horizontal shift register gives an instruction to read a digital signal latched in the latch circuit.

Next, the pixel module 4 of the sensor core 3 will be described in detail with reference to FIG. 2.

Figure 2:
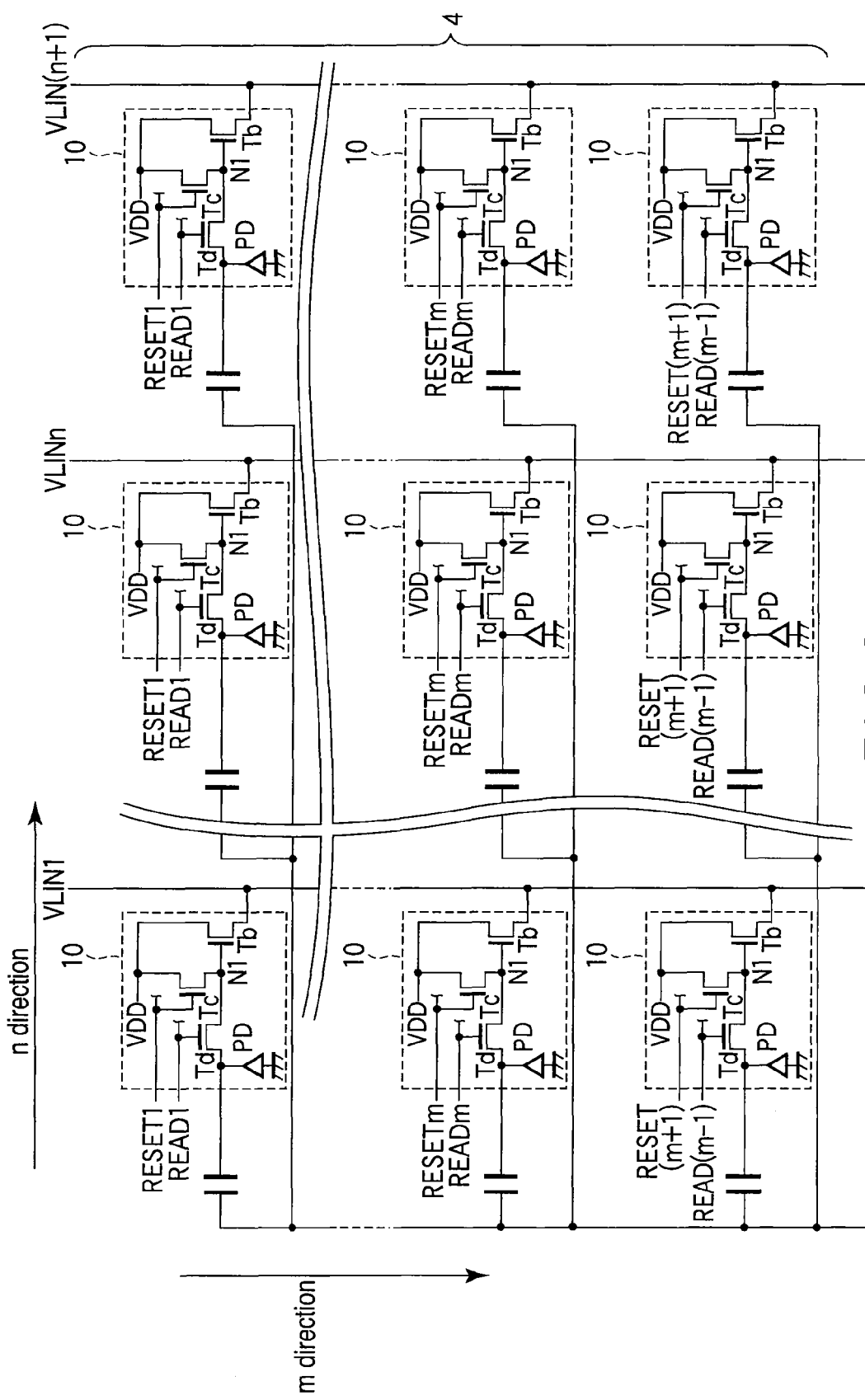
FIG. 2 is a block diagram of a sensor core portion according to the first embodiment.

FIG. 2 is a block diagram of the sensor core 3.

<Pixel Module 4>

As shown in FIG. 2, (m+1) number of pixels are arranged in the vertical direction in the pixel module 4, such that each of them is connected to a corresponding one of vertical signal lines VLIN1 to VLIN(n+1) (where both of n and m are natural numbers). That is, the pixel module 4 includes a plurality of pixels 10 arranged in a matrix. Hereinafter, the vertical signal line VLIN1 will be noted, and a description will be made with regard to the pixel 10 arranged on a first line in the horizontal direction crossing the vertical signal line VLIN1.

As shown, the pixel 10 includes MOS transistors Tb, Tc, Td, and a photodiode PD. An electrode, not shown, is formed in a cathode of the photodiode PD, and a negative voltage is applied to the electrode from the power source 2. As will be described later, after the negative voltage is applied to the electrode, a capacitance is formed between the electrode and the photodiode PD. That is, in the pixel 10 arranged on an (m+1)th line in the horizontal direction crossing the vertical signal line VLIN (n+1), a capacitance is formed. Each of the capacitances has approximately the same characteristics.

A signal RESET1 given from the controller 5 is given to a gate of MOS transistor Tc, a voltage VDD (of 2.8 V, for example) is supplied to a drain terminal thereof, and a source terminal thereof is connected to a connection node N1. That is, MOS transistor Tc functions as a reset transistor configured to produce a reset voltage that is used as a reference voltage of a signal read from the photodiode PD.

A gate of MOS transistor Td receives a signal READ1 supplied from the controller 5, a drain terminal thereof is connected to a connection node N1, and a source terminal thereof is connected to a cathode of the photodiode PD. That is, MOS transistor Td functions as a transistor designed to read signal charges. It is to be noted that an anode of the photodiode PD is grounded.

A connection node N1 is connected to a gate of MOS transistor Tb, a voltage VDd is supplied to a drain terminal thereof, and a vertical signal line VLIN1 is connected to a source terminal thereof. That is, a gate of MOS transistor Tb, a source terminal of MOS transistor Tc, and a drain terminal of MOS transistor Td are commonly connected via the connection node N1. The connection node N1 is a node configured to detect a potential. It is to be noted that MOS transistor Tb functions as an amplification transistor designed to amplify signals. MOS transistor Tb may also be referred to as a MOS transistor Amp.

The signal lines that transmit the signals RESET1 and READ1 are commonly connected at the pixel 10 arranged in the first line in the horizontal direction crossing the vertical signal line VLIN. That is, the signal lines are the first line in the horizontal direction crossing the vertical signal line VLIN, and are commonly connected to each of the pixels 10 connected to a corresponding one of the vertical signal lines VLIN1 to VLIN(n+1). The same applies to the second to (m+1)th lines in the horizontal direction crossing the vertical signal line VLIN.

The pixels 10 arranged in the same row are commonly connected to one of the vertical signal lines VLIN1 to VLIN(n+1) via a source terminal of MOS transistor Tb. Hereinafter, when the vertical signal lines VLIN1 to VLIN(n+1) are not distinguished from one another, they will simply be referred to as a vertical signal line VLIN.

Further, one of the signals RESET1 to RESET(m+1) and the signals READ1 to READ(m+1) is commonly given to the pixels 10 in the same row. Hereinafter, the signals RESET1 to RESET(m+1) and the signals READ1 to READ(m+1) will also be simply referred to as signals RESET and READ, respectively, when they are not distinguished from one another.

When the sensor core 3 includes a CDS circuit, an ADC module, a latch circuit, and a horizontal shift register, the CDS circuit, the ADC module, the latch circuit, and the horizontal shift register are connected to each of the vertical signal lines VLIN in FIG. 2.

<Configuration Example of Pixel 10>

Next, a configuration example of the pixel 10 included in the solid-state imaging device according to the present embodiment will be described, with reference to FIGS. 3 and 4. The cross-sectional configuration example shown in FIG. 4 is a cross-sectional view along direction A-A in FIG. 3. With respect to a silicon substrate 20, the side on which an insulating film 25 is formed will be referred to as a first direction, and the opposite direction, i.e., the bottom surface of the silicon substrate 20 will be referred to as a second direction. As described above, a solid-state imaging device of a back irradiation type will be described in the present embodiment. That is, a description will be made with reference to a solid-state imaging device of a back irradiation type, in which a light reception surface is formed on a substrate surface (bottom side) opposite to a top surface (top side) of the semiconductor substrate on which MOS transistor Tb is formed. That is, the side opposite to the side on which a semiconductor element is formed is the side exposed to the incident light, and becomes a back surface. Hereinafter, a description will be made with reference to a plan configuration example of the substrate surface.

As shown in FIG. 4, the pixel 10 is arranged in an active area AA and on a top surface of the silicon substrate 20. The silicon substrate 20 is a p-type semiconductor substrate in which impurities, such as Boron, are doped. The silicon substrate 20 may be an epitaxially grown epitaxial layer (hereinafter also referred to as a semiconductor region 20).

Figure 3:
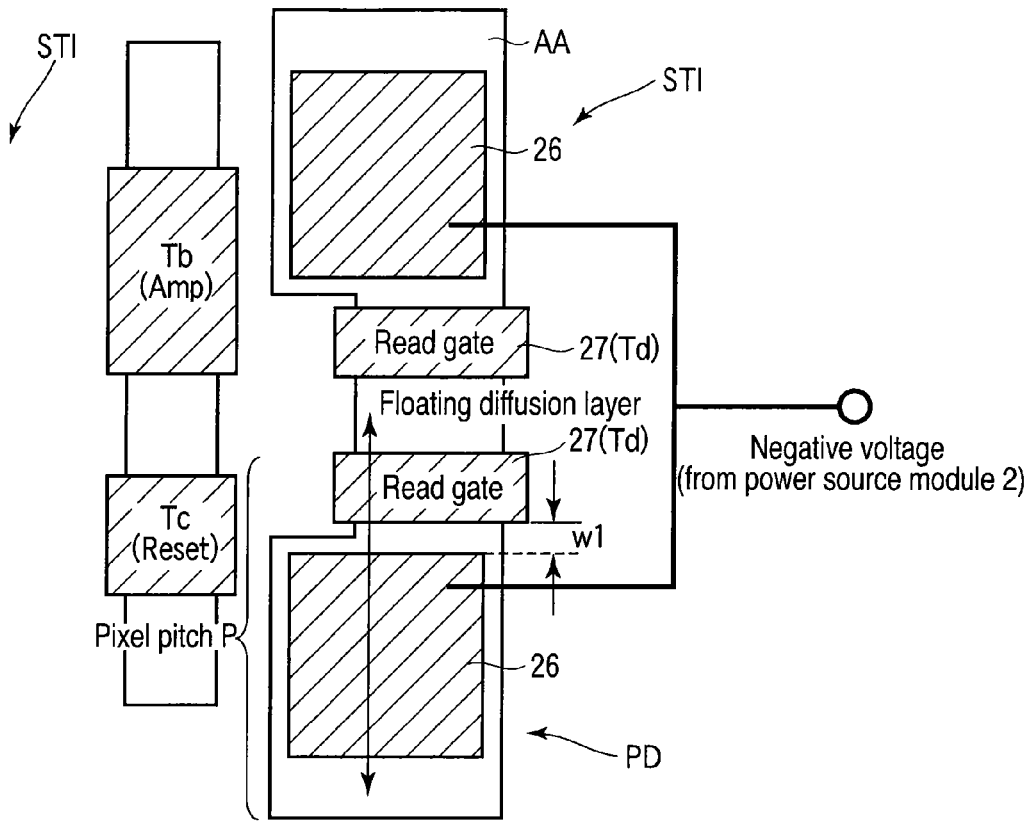
FIG. 3 is a plan view of a pixel according to the first embodiment.
Figure 4:
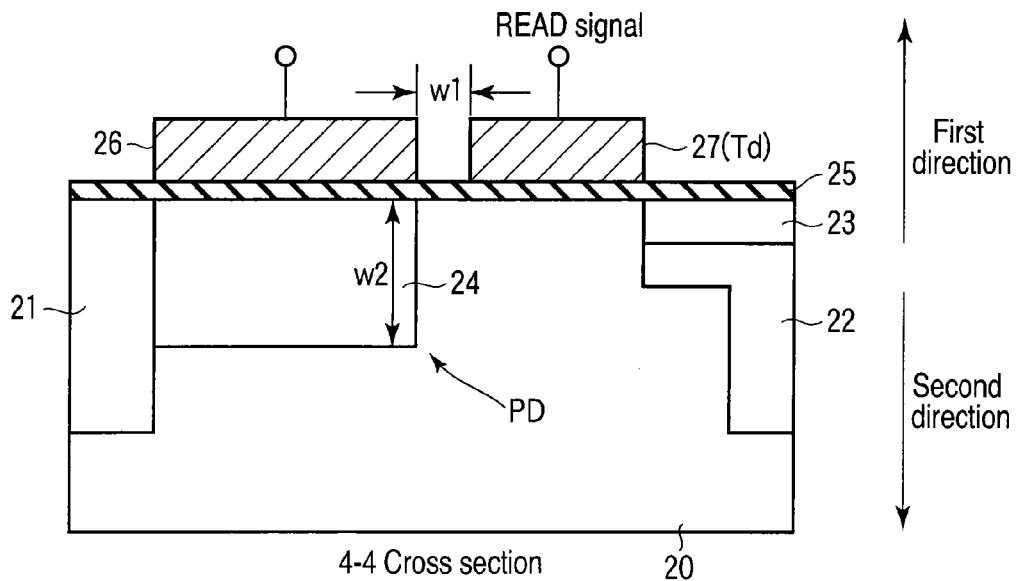
FIG. 4 is a cross-sectional view of the pixel according to the first embodiment.

Further, an element separation band (shown as STI in FIG. 3) dividing the element separation region is provided so as to surround the active area AA (shown as AA in FIG. 3). The silicon substrate 20 may be an n-type in which phosphorous, for example, is doped.

On the silicon substrate 20, potential layers, such as an electrode 26 and an electrode 27, are formed at an interval of a width w1.

An n-type diffusion layer 24 forming the pixel 10 is formed directly below the electrode 26. The electrode 27 functions as a read gate of MOS transistor Td, configured to read electrons accumulated in the n-type diffusion layer 24 to a floating diffusion layer 23. Hereinafter, the electrode 27 may be referred to as a read electrode. The electrode 26 is polycrystalline silicon, a metal silicide obtained by bonding a portion of polycristalline silicon with a metal, such as CoSi, TiSi and NiSi, or a metal material such as Cu, Al, and W. Further, as shown, the pixel pitch P is common in the direction of the vertical signal line VLIN per pixel unit according to the present embodiment.

Further, gate electrodes (shown as Tb (Amp) and Tc (Rese) in FIG. 3) forming a reset transistor Tc and an amplification transistor Tb, respectively, are formed on the active area AA. That is, impurity diffusion layer, not shown, configured to function as a source and drain of the transistors Tc, Tb, is formed on the top surface of the active area AA.

Next, a cross-sectional configuration example of the pixel 10 will be described, with reference to FIG. 4.

As shown in FIG. 4, an n-type diffusion layer 24, which functions as a charge accumulation portion configured to accumulate electrons produced in the semiconductor substrate, is formed on the top surface of the semiconductor substrate 20 (on the first direction side) formed of p-type silicon, for example, by doping boron, for example. The bottom surface of the n-type diffusion layer 24 is positioned deeper than the top surface of the semiconductor substrate 20 by w2 (>w1) toward the second direction.

A p-type diffusion layer 21 is formed in the semiconductor substrate 20 so as to be adjacent to the n-type diffusion layer 24. At least a portion of the diffusion layer 21 is grounded. That is, the diffusion layer 21 has zero potential. The diffusion layer 21 functions as a supply source that forms a hole accumulation layer, which will be described later. Further, the diffusion layer 21 functions as an element separation region.

Further, an n-type diffusion layer 23, which functions as a floating diffusion layer, is formed on the top surface of the semiconductor substrate 20. A p-type diffusion layer 22 is formed on the semiconductor substrate 20 so as to contact the bottom surface of the diffusion layer 23.

An insulating layer 25 is formed on the semiconductor substrate 20, and an electrode 26 is formed such that the diffusion layer 24 is formed directly below the electrode 26. Further, a negative voltage of approximately −1 V, for example, supplied from the power source 2 is applied to the electrode 26. Further, an electrode 27 is formed on the insulating film 25 and adjacent to the electrode 26 at an interval of the width w1. A signal READ of a positive voltage supplied from the controller 5 is applied to the electrode 27.

<Read Operation>

Figure 5:
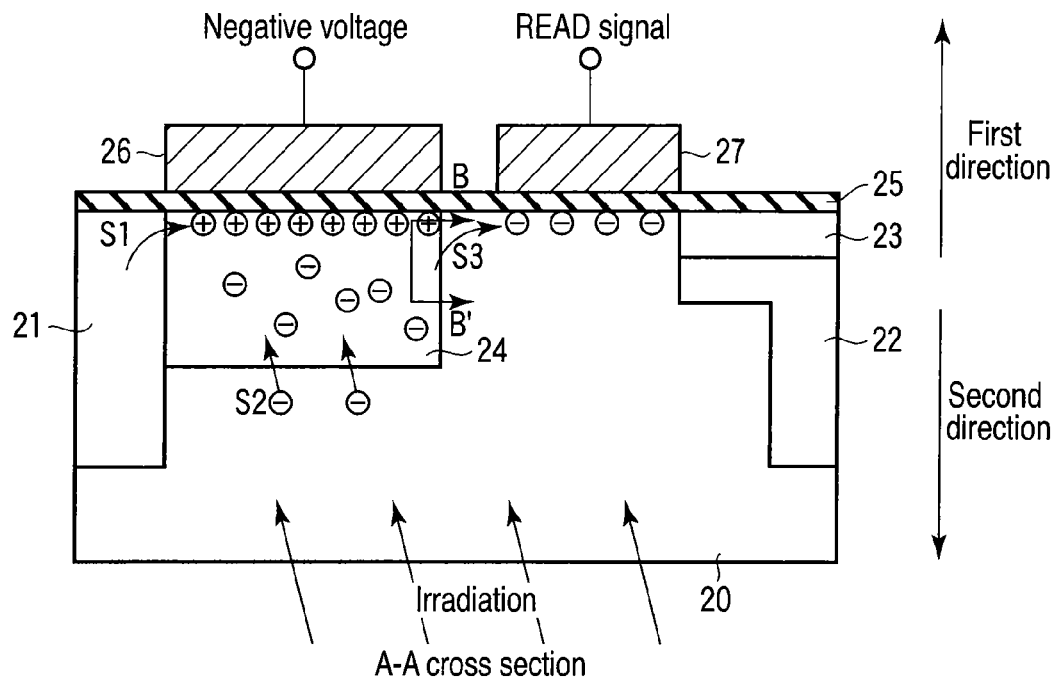
FIG. 5 illustrates a read operation of a solid-state imaging device according to a first embodiment.
Figure 6:
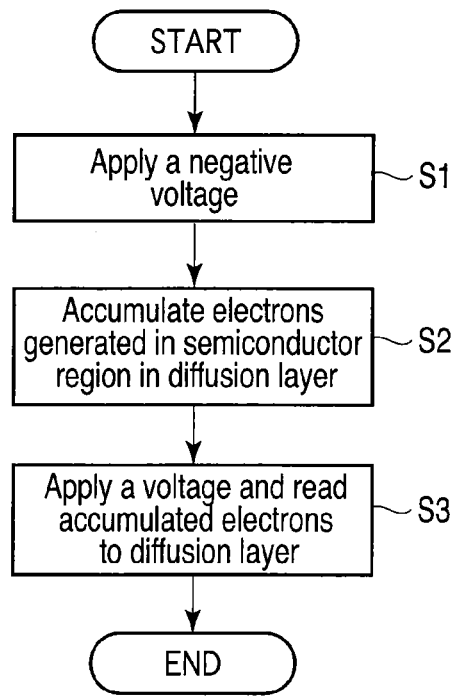
FIG. 6 is a flowchart illustrating a data read operation according to the first embodiment.
Figure 7:
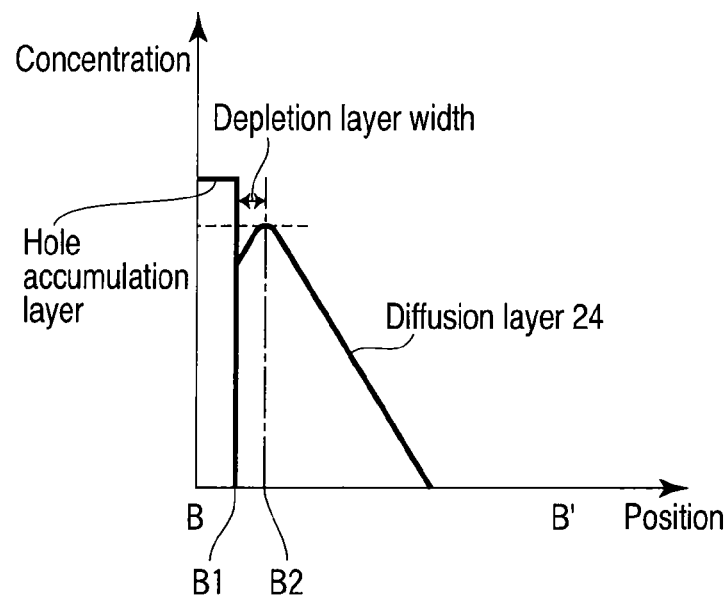
FIG. 7 is a graph illustrating a concentration distribution of a solid-state imaging device according to the first embodiment.

Next, a method of reading light received by the solid-state imaging device 1 via the photodiode PD will be described, with reference to FIGS. 5 and 6. FIGS. 5 and 6 illustrate an operation of reading electrons included in the electron-hole pair produced in the semiconductor substrate 20 using light that has passed through the lens 6, not shown, and divided by the filter, to the outside via the transistor Td. The timing of the voltage applied to the electrodes 26, 27 is controlled by the controller 5.

(Step S1)

First, a negative voltage of approximately −1 V is applied to the electrode 26 by the power source 2, at least during light reception. Thereby, a hole induced by the diffusion layer 21 set to zero potential moves to an interface between the diffusion layer 24 and the insulating film 25, in other words, to an interface between the upper surface of the semiconductor substrate and the insulating film 25 (S1 in FIGS. 5 and 6).

Thereby, a depletion layer is produced between the hole induced in an interface between the diffusion layer 24 and the insulating film 25 and the diffusion layer 24. Hereinafter, the layer of the holes induced by the interface of the semiconductor substrate 20 will be referred to as a hole accumulation layer, or a charge accumulation layer (layer in which holes are accumulated). It is to be noted that the hole accumulation layer has a very small depth (thickness) in the second direction, and is formed only in the interface of the semiconductor substrate 20. More specifically, the width of the hole accumulation layer is set to be approximately 0.01 to 0.05 μm. As a result thereof, if the negative voltage takes a certain value, the value of the accumulation capacity of the depletion layer becomes a value determined according to the width of the depletion layer. That is, the number of electrons that may be accumulated in the depletion layer is proportional to the value of the accumulation capacity of the depletion layer, and the number of electrons increase as the value of the accumulation capacity increases. Further, the concentration of the hole accumulation layer varies according to the size of the voltage applied to the electrode 26. That is, as the value (absolute value) of the negative voltage applied to the electrode 26 increases, the concentration of the hole accumulation layer increases.

(Step S2)

Next, light is received along the first direction from the back surface of the substrate 20, i.e., from the back surface side of the semiconductor substrate 20, and thereby electrons included in the electron-hole pairs produced in the semiconductor substrate 20 move to the diffusion layer 24 (S2 in FIGS. 5 and 6). This is because of the electric field and thermal diffusion produced in the semiconductor substrate 20. The produced electrons are accumulated in the diffusion layer 24 in which the depletion layer is formed.

(Step S3)

After step S2, a pulsed positive voltage (signal READ) in the form of a pulse is applied to the electrode 27 via the power source 2, while a negative voltage is applied to the electrode 26. Thereby, a channel is formed directly below the electrode 27 and on the top surface of the semiconductor substrate 20. As a result thereof, the electrons accumulated in the diffusion layer 24 are read to the outside via the diffusion layer 23, via a channel formed directly below the electrode 27 (S3 in FIGS. 5 and 6). Thus, the light received by the pixel 10 is read to the outside as charge. It is to be noted that the hole accumulation layer induced in the interface between the diffusion layer and the insulating film 25 when the electrons are accumulated in the diffusion layer is formed in continuation during steps S1 to S3. In other words, the hole accumulation layer is formed during steps S1 to S3, when a negative voltage is applied to the electrode 26.

<Concentration Distribution on the Top Surface of the Semiconductor Substrate 20>

Next, the concentration distribution on the top surface of the semiconductor substrate 20 will be described with reference to FIG. 6, when a negative voltage is applied to the electrode 26 in FIG. 5. More specifically, concentration distribution of carriers, such as holes and electrons, in the diffusion layer 24 and the interface between the diffusion layers 24 and the insulating film 25 will be described. FIG. 6 is a graph illustrating the concentration distribution of holes and electrons in a cross-sectional view along direction B-B' in FIG. 5. The vertical axis shows the concentration, and the lateral axis shows the position in cross section B-B'. Position B is on the top surface of the semiconductor substrate 20.

As shown in FIG. 6, when a negative voltage is applied to the electrode 26, a hole accumulation layer is produced on the entire interface between the diffusion layer 24 and the insulating film 25 on the top surface of the semiconductor substrate 20. In other words, the hole concentration is distributed in the shape of a δ function between positions B and B1. Further, as described above, the width of the hole accumulation layer formed from position B to position B1 is approximately from 0.01 to 0.5 μm. Position B2 indicates the peak of the concentration of electrons in the diffusion layer 24. The width of the depletion layer is determined by the distance between the position indicating the peak of the hole concentration and the position indicating the peak of the electron concentration. That is, the interval between positions B1 and B2 is the depletion layer width, as shown in FIG. 6. The accumulation capacity is determined by the depletion layer width. That is, when the value of the depletion layer width decreases, the concentration of electrons that may be accumulated in the diffusion layer 24 increases.

Advantageous Effects of the Present Embodiment

According to the solid-state imaging device and a method of controlling the same, the quality of a playback screen may be improved.

Advantageous effects of the solid-state imaging device and a method of controlling the same according to the present embodiment will be described, compared to the conventional solid-state imaging device.

For example, assume a configuration of a conventional solid-state imaging device in which a p-type diffusion layer and an electrode 26 is not formed on the diffusion layer 24 shown in FIG. 4 and in the semiconductor substrate 20. Here, the diffusion layer refers to a region in which the semiconductor is doped with impurities and has polarity. In this configuration, assume that this diffusion layer is not formed and only an n-type diffusion layer 24 is formed on the top surface of the semiconductor substrate 20. When electrons produced in the semiconductor substrate 20 during light reception are accumulated in the diffusion layer 24, a depletion layer is produced in the interface between the semiconductor substrate 20 and the insulation film 25 and in the vicinity thereof, and a dark current is produced due to the depletion layer. The dark current refers to a current that flows due to production of electrons and holes in the semiconductor substrate 20 even in the period (hereinafter referred to as a dark period) when a photodiode PD does not receive light. That is, a current flows even during the dark period due to the flow of electrons, and becomes the cause of noise. One of the concrete reasons for production of the dark current is considered to be difference in the discontinuous configuration in the interface between the semiconductor substrate 20 and the insulating film 25 (such as an oxide film). More specifically, one of the regions interposing the interface is made of silicon, which has a stable configuration, and the other region is formed by bonding silicon and oxide in an amorphous form. That is, in that interface, a regular bonding state may not be maintained, and an unstable state in which the silicon atom in the semiconductor substrate 20 region does not have a partner to bond to, i.e., a dangling bond forms a level in the center of the band gap of Si. Thereby, the atom that may not find a partner, or a dangling bond is produced and becomes a recombination center. The production and the recombination center help thermal excitation, for example, of electrons existing in the valency electron band. Thereby, electrons excited by the valency electron band excite to a conduction band via the production and the recombination center. That is, holes from which electrons are omitted are produced in the valency electron band, and electrons exist in the conduction band. The electrons produced in the interface via the production and the recombination center are accumulated in the distribution layer 24. By thus receiving light, a dark current is produced besides the electrons produced in the semiconductor substrate 20 (which will be referred to as Problem 1).

In order to prevent the production of the dark current, the conventional solid-state imaging device forms a p-type diffusion layer (not shown), in which holes made of boron, for example, are doped, in the semiconductor substrate 20. Thereby, production of electrons from the depletion layer is suppressed in the interface of the semiconductor substrate 20, and thereby the dark current is prevented.

When the p-type diffusion layer is formed such that the diffusion layer 24 is arranged directly below the p-type diffusion layer, however, it is difficult to adjust the concentration peak of the diffusion layer 24 in the interface contacting the diffusion layer 24. Accordingly, the length of an electric flux line (electric field) traveling from the holes toward the electrons increases, and thereby the accumulation capacity may not be increased. That is, since the accumulation capacity is small, the number of saturated electrons in the diffusion layer 24 decreases, and thereby the signal-to-noise ratio decreases in the case where a bright target is photographed, for example. More specifically, the noise included in an image obtained by photographing a bright target is determined by light shot noise. The noise in the light shot noise may be expressed by $\sqrt{n}$, where the number of electrons accumulated in the photodiode PD (the diffusion layer 24 in this case). That is, since the signal-to-noise ratio is expressed by $n/\sqrt{n}$, the signal-to-noise ratio decreases as the number of saturated electrons decreases. This results in the problem that the quality of a photographed image deteriorates (which will be referred to as Problem 2).

In the present embodiment, on the other hand, Problems 1 and 2 may be prevented. According to the solid-state imaging device and a method of controlling the same, the diffusion layer 21 is grounded, and a negative voltage is applied to the electrode 26. Thereby, the potential of the diffusion layer 21 may be made higher than the electrode 26. Thereby, the holes induced from the diffusion layer 21 may be formed directly below the electrode 26 and on the upper surface of the diffusion layer 24, and a hole accumulation layer is formed. Accordingly, production of a dark current on the top surface of silicon (Si) is prevented. That is, it is possible to reduce the noise, and to improve the quality of a playback screen. It is thereby possible to prevent Problem 1.

The width of the hole accumulation layer is smaller than the depth of the p-type diffusion layer formed in the conventional solid-state imaging device in the second direction. More specifically, the depth of the conventional p-type diffusion layer in the second direction ranges from 0.10 to 0.5 μm. On the other hand, the depth of the solid-state imaging device in the second direction according to the present embodiment is 1/10 of the conventional one. As a result, the width of the depletion layer becomes smaller than the depletion layer in the conventional solid-state imaging device. Thereby, the accumulation capacity of the diffusion layer 24 increases. Thereby, even if miniaturization of the pixels 10 is enhanced and the region (area) of the hole accumulation layer formed on the top surface of the substrate 20 is decreased, the capacity per unit area increases, and therefore the number of saturated electrons in the diffusion layer 24 increases. Thereby, the signal-to-noise ratio increases. That is, Problem 2, i.e., deterioration of the quality of photographed images may be prevented.

Further, according to the solid-state imaging device and a method of controlling the same of the present embodiment, a distance w1 between the electrode 27 and the electrode 26 is shorter than a depth w2 of the diffusion layer 24 forming the photodiode PD. Accordingly, when a pulsed signal READ is applied to the electrode 27 and electrons accumulated in the diffusion layer 24 are read, the region of the substrate 20 in which the potential is modulated by the electrode 27 approaches the region of the diffusion layer 24. As a result thereof, all the electrons accumulated in the diffusion layer 24 may be easily read.

It is to be noted that the voltage applied to the electrode 26 by the power source 2 does not need to be a negative voltage, and it only needs to be capable of applying a voltage lower than the potential of the diffusion layer 21 to the electrode 26. That is, the voltage applied to the electrode 26 only needs to be a voltage capable of inducing holes from the diffusion layer 21 to the upper surface of the diffusion layer 24.

Further, the solid-state imaging device according to the present embodiment is a back irradiation type. That is, the light incident direction shown in FIG. 5 is the first direction. Accordingly, even if a material with a low light transmittance is used as the electrode 26, the amount of light made incident on the diffusion layer 24 does not attenuate.

Second Embodiment

Next, the solid-state imaging device and a method of controlling the same according to the second embodiment will be described. In the solid-state imaging device and a method of controlling the same according to the second embodiment, an electrode 26 is formed of a transparent electrode (a transparent electrode 40, which will be described later) formed of an indium tin oxide (ITO) film, for example, capable of transmitting received light. That is, the light reception direction may be from the back surface, as in the case of the first embodiment, or from the top surface side. Further, the negative potential that is applied to the electrode 26 in step S3 in the read operation in the first embodiment is stopped when the negative potential is transferred to a channel formed directly below the electrode 27.

Hereinafter, only the structures and operations different from those of the first embodiment will be described.

Figure 8:
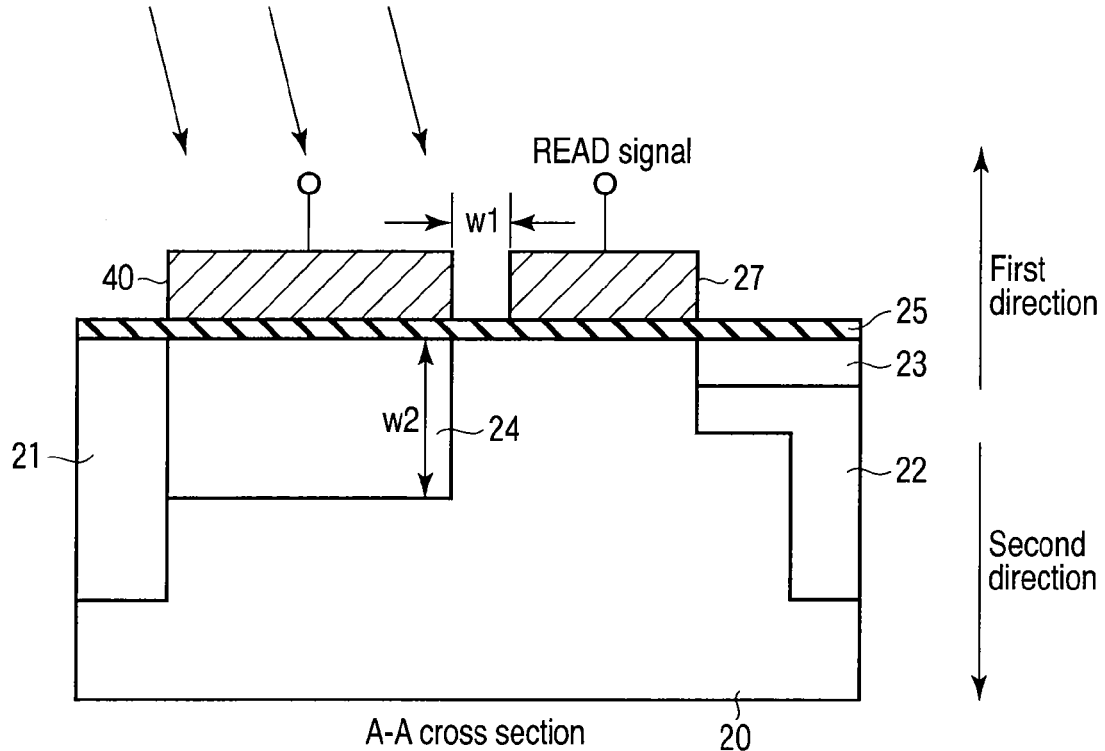
FIG. 8 is a cross-sectional view of a pixel according to a second embodiment.

A solid-state imaging device according to the present embodiment is shown in FIG. 8. FIG. 8 is a cross-sectional view along direction A-A of the pixel 10 shown in FIG. 2. As shown in FIG. 8, the solid-state imaging device of the present embodiment has a configuration in which the transparent electrode 40 is provided, instead of the electrode 26. The transparent electrode 40 is formed of an indium tin oxide (ITO) film, for example. The transparent electrode 40 has transmittance with respect to visible light of approximately 400 to 700 nm.

In the solid-state imaging device and a method of controlling the same according to the present embodiment, it is possible to stop application of a negative voltage to the transparent electrode 40 and to cause a power module 2 to apply a pulsed positive voltage (signal READ) to the electrode 27.

As in the case of the first embodiment, electrons are excited directly below the electrode 27 and the top surface of the semiconductor substrate 20. That is, a channel is formed.

Since application of a negative voltage to the transparent electrode 40 is stopped, a hole accumulation layer that has been excited directly below the transparent electrode 40 and in the interface of the diffusion layer 24 is diminished.

As a result thereof, electrons accumulated in the diffusion layer 24 are read to the outside via the channel. The period during which the negative voltage applied to the transparent electrode 40 is stopped is the period during which the pulsed positive voltage is applied to the electrode 27. At least, the period (period during which 0 V is applied to the transparent electrode 40) during which a negative voltage is not applied to the transparent electrode 40 and the period during which a pulsed positive voltage is applied to the electrode 27 needs to be overlapped with each other.

Even during the period when a pulsed positive voltage is applied to the electrode 27, a negative voltage of approximately −1 V may be applied to the transparent electrode 40. That is, the operation of the present embodiment may be applied even in the configuration of the first embodiment.

The above-described hole accumulation layer excited in the interface of the semiconductor substrate 20 when electrons are accumulated in the diffusion layer 24 is formed during steps S1 and S2. In other words, the hole accumulation layer is formed during the period of steps S1 and S2, when a negative voltage is applied to the transparent electrode 40.

Advantageous Effects of the Present Embodiment

In the solid-state imaging device and a method of controlling the same according to the present embodiment, advantageous effects as may be obtained from the first embodiment may be obtained. That is, even when a negative voltage of approximately −1 V is applied to the transparent electrode 40, a hole accumulation layer may be formed on the top surface of the semiconductor substrate 20 and in the interface between the diffusion layer 24 and the insulating film 25. Since the hole accumulation layer formed thereby has a concentration as high as the first embodiment, and is thinner than the conventional ones, the accumulation capacity of the photodiode PD increases. Thereby, even if miniaturization of the solid-state imaging device is enhanced, it is possible to suppress deterioration of the signal-to-noise ratio, and to prevent deterioration of the image of the target.

While the transparent electrode 40 is arranged on the insulation film 25 such that the diffusion layer 24 is arranged directly below the transparent electrode 40 in FIG. 8, the transparent electrode 40 may be formed on the entire surface of the insulating film 25 including the electrode 27, as shown in FIG. 8. In that case, it is necessary to form an insulating film 28 so as to surround the electrode 27, such that a short is not caused in the electrode 27 and the transparent electrode 40.

Figure 9:
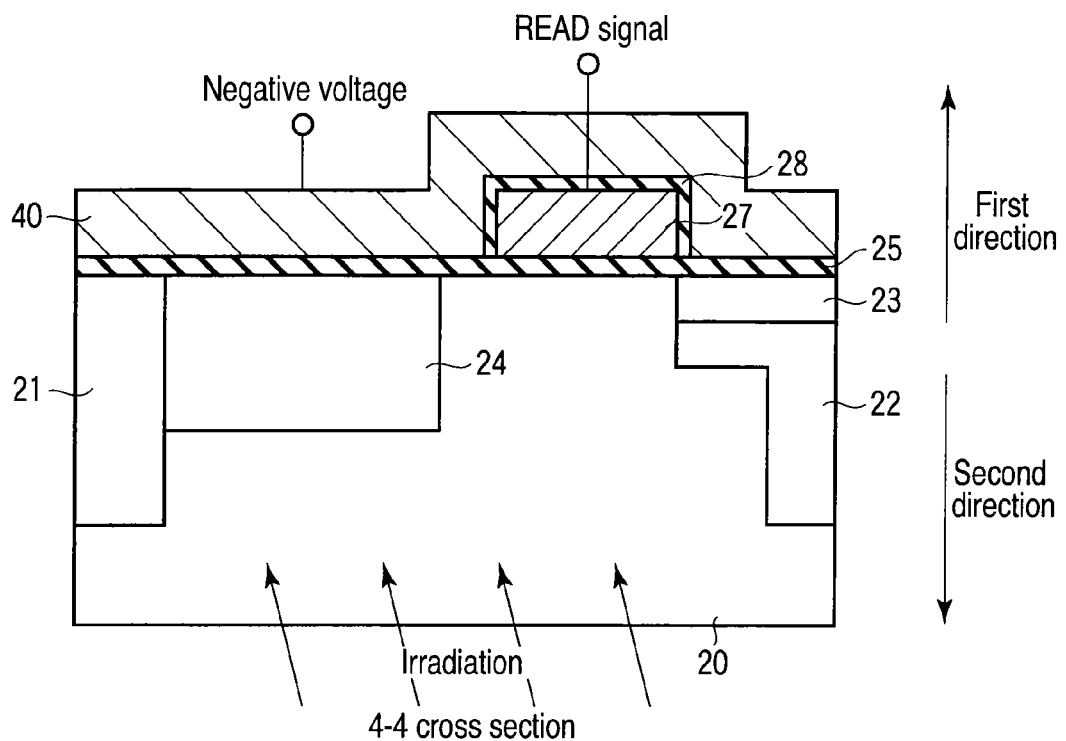
FIG. 9 is a cross-sectional view of a pixel according to the second embodiment.

FIG. 9 is a cross-sectional view along direction A-A of the pixel 10 in the solid-state imaging device according to the present embodiment. In this case, too, the above-described advantageous effect may be obtained.

Further, according to the solid-state imaging device and a method of controlling the same of the present embodiment, application of a negative voltage to the transparent electrode 40 is stopped during the period when a pulsed positive voltage is applied to the electrode 27, as described above. Since the concentration of the hole accumulation layer accumulated in the region positioned directly below the transparent electrode 40 and in the interface of the substrate 20 noticeably decreases, the potential of the substrate 20 directly below an end portion (the one closer to the side of the transparent electrode 40) in a gate width direction of the electrode 27 is easily modulated by the electrode 27. Thereby, signal electrons accumulated in the diffusion layer 24 may be further easily transferred, and the electrons accumulated in the diffusion layer 24 will not remain. That is, since the problem of the residual image, for example, does not occur when electrons do not remain in the diffusion layer 24, image quality may be improved especially in the dark period.

Further, as described above with reference to FIG. 8, since the transparent electrode 40, capable of letting visible light pass through is used in the solid-state imaging device shown in FIG. 9, the above-described configuration is applicable to the conventional top irradiation type, as well as a back irradiation type.

Third Embodiment

Next, a solid-state imaging device and a method of controlling the same according to the third embodiment will be described. In the solid-state imaging device according to the present embodiment, an insulating film 41, for example, is formed instead of the first and second electrodes 2 and the transparent electrode 40. The insulating film 41 is a potential layer formed of a potential layer having transmittance against visual light of approximately 400 to 700 nm and including a negative solid-state charges, such as a film formed of hafnium oxide. Hereinafter, only the configuration different from those of the first and second embodiment will be described.

Figure 10:
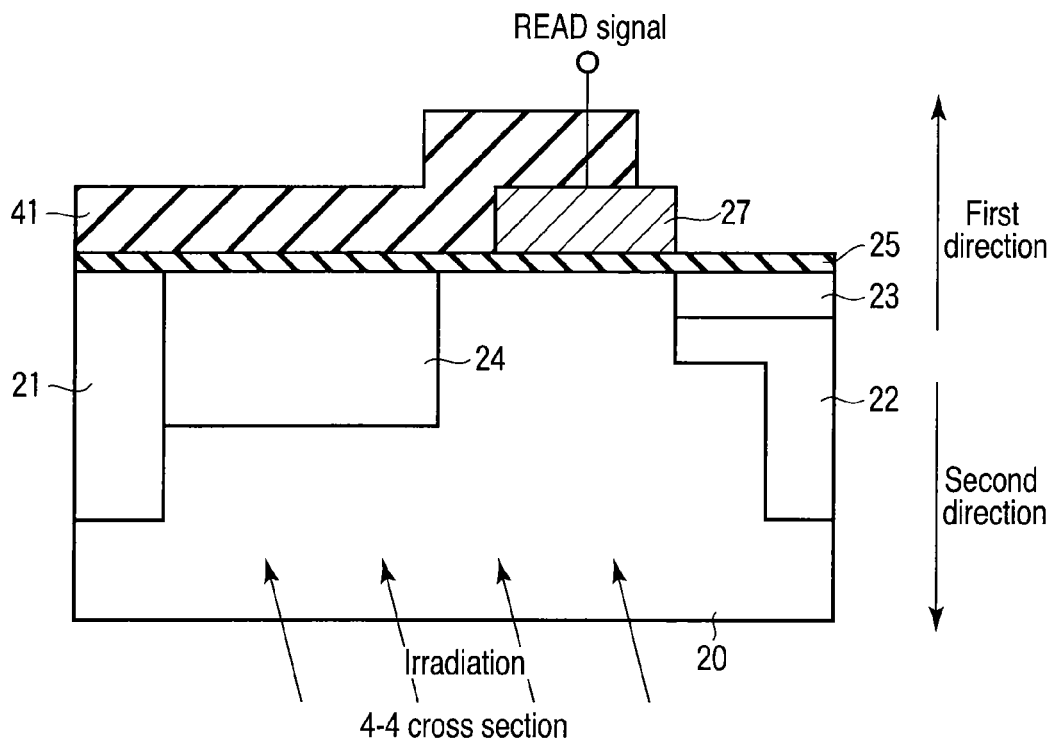
FIG. 10 is a cross-sectional view of a pixel according to a third embodiment.

Next, a solid-state imaging device according to the present embodiment will be described with reference to FIG. 10. FIG. 10 is a cross-sectional view along direction 10-10 of the pixel 10 in FIG. 2. As shown in FIG. 9, the solid-state imaging device according to the present embodiment has a configuration in which an insulating film 41 including a negative solid-state charges is provided, instead of the electrode 26 or the transparent electrode 40. That is, the insulating film 41 has a negative potential with respect to the diffusion layer 21. Accordingly, even if a negative voltage is not supplied from the power source 2, as described in the first and second embodiments, a hole accumulation layer may be excited on the top surface of the semiconductor substrate 20 and in the contact interface between the diffusion layer 24 and the insulating film 25. That is, since a hole accumulation is always produced even if a negative voltage is not applied, electrons produced in the semiconductor substrate 20 by receiving light are accumulated in the diffusion layer 24. Since configurations other than the electrode 26 and the transparent electrode 40 and the read operation of the solid-state imaging device, other than the application of a negative voltage to the electrode 26 and the transparent electrode 40 according to the present embodiment is the same as those of the first and second embodiment, description of such a configurations will be omitted.

Advantageous Effects of the Present Embodiment

According to the solid-state imaging device and the method of controlling the same of the present embodiment, the advantageous effects as may be obtained from the first embodiment may be obtained. That is, even when the insulating film 41 including a negative fixed charge is used instead of the electrode 26 and the transparent electrode 40, a hole accumulation layer may be formed on the top surface of the semiconductor substrate 20 and in the interface between the diffusion layer 24 and the insulating film 25. Since the formed hole accumulation layer has a concentration as high as that of the first embodiment and is thinner than the conventional one, the accumulation capacity of the photodiode PD increases. Thereby, even if miniaturization of the solid-state imaging device is enhanced, it is possible to suppress deterioration in the signal-to-noise ratio and to prevent deterioration of the image of the target.

In FIG. 10, the insulation film 41 is formed on the insulation film 25 so as to partially cover the electrode 27. The insulation film 41, however, may be arranged on the insulation film 25 such that the diffusion layer 24 is arranged directly below the insulation film 41 in a position apart from the electrode 27 by the width w1. Since it is difficult to form the insulating film 41 and the electrode 27 in a self-aligning manner and the insulation film 41 may partially cover the top surface of the electrode 27, the configuration shown in FIG. 10 is often adopted.

Further, as in the case of the second embodiment, since the insulating film 41 having transmittance against the visual light of approximately 400 to 70 nm is used, the present embodiment is applicable to a conventional top irradiation type, as well as a back irradiation type.

Further, as described above, the operation of the second embodiment is applicable to the configuration of the first embodiment. That is, in the first embodiment, a pulsed positive voltage may be applied by the power source 2 to the electrode 27, while application f a negative voltage to the electrode 26 is stopped. That is, when electrons are accumulated in the diffusion layer 24, that is, during the period of steps S1 and S2, a hole accumulation layer is excited in the interface of the semiconductor substrate 20. In other words, this hole accumulation layer is formed during the period of steps S1 and S2, when a negative voltage is applied to the electrode 26. In that case, even in the first embodiment, the advantageous effect as may be obtained from the second embodiment may be obtained. That is, since electrons will not remain in the diffusion layer 24, and thereby the problem of the residual image, for example, does not occur, image quality may be improved especially in a dark-period image.

Further, the hole accumulation layer has been described above as formed by accumulating holes by applying a negative voltage to the electrode 26, but a p-type diffusion layer may be formed on the top surface of the diffusion layer 24, and thereby holes may be accumulated on the top surface of the diffusion layer 24.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a pixel which includes a photodiode, a potential layer, and a read transistor, the photodiode carrying out photoelectric conversion on received light and receiving an electron, the potential layer being provided in a cathode of the photodiode, the read transistor transferring the electron subjected to photoelectric conversion by the photodiode to a floating diffusion layer; and
a power module which transfers a voltage to the potential layer,
wherein the voltage is a negative voltage,
the negative voltage is applied to the potential layer during a period in which the electron generated in the photodiode by receiving light is accumulated in the photodiode, and the negative voltage is not applied to the potential layer during reading of the electron accumulated in the photodiode.

2. The device according to claim 1, wherein the photodiode includes a first diffusion layer formed in a semiconductor region surface of a first or second conductivity type, the first diffusion layer is formed to a position at a first depth from the semiconductor region surface, and a distance between the read electrode and the potential layer included in the read transistor is smaller than the first depth.

3. The device according to claim 2, wherein the first diffusion layer is doped such that a concentration becomes a maximum value in a position at a second depth from the semiconductor region surface, the second depth being smaller than the first depth, and a charge accumulation layer of the first conductivity type is formed when the electron produced in the semiconductor region by light irradiated toward the semiconductor region is accumulated in the first diffusion layer which functions as a charge accumulation portion, the charge accumulation layer having a third depth smaller than the second depth from an interface between the semiconductor region surface and the surface of the first diffusion layer.

4. The device according to claim 3, wherein when the negative voltage is applied to the potential layer, a capacitance is formed between the potential layer and the photodiode, and the capacitance is formed by the charge accumulation layer of the first conductivity type and the first diffusion layer.

5. The device according to claim 4, wherein a value of the capacitance is determined according to a distance between the third depth at which the charge accumulation layer of the first conductivity type is formed and the second depth.

6. The device according to claim 2, wherein the first diffusion layer is doped such that a concentration becomes a maximum value in a position at a second depth from the semiconductor region surface, the second depth being smaller than the first depth, and a charge accumulation layer of the first conductivity type is formed when the electron produced in the semiconductor region by light irradiated from back surface of the semiconductor region is accumulated in the first diffusion layer which functions as a charge accumulation portion, the charge accumulation layer having a third depth smaller than the second depth from an interface between the semiconductor region surface and the surface of the first diffusion layer.

7. The device according to claim 6, wherein the potential layer is a transparent conductive film, the incident light is capable of passing through the transparent conductive film, and a second voltage is applied to the read electrode after a first voltage applied to the transparent conductive film is stopped, the first voltage being a voltage smaller than a voltage of a second diffusion layer contacting the first diffusion layer and being the negative voltage, the second voltage being a positive voltage.

* * * * *